United States Patent
Koch et al.

(10) Patent No.: US 8,823,362 B2
(45) Date of Patent: *Sep. 2, 2014

(54) CURRENT SENSOR ARRANGEMENT FOR MEASURING CURRENTS IN A PRIMARY CONDUCTOR

(75) Inventors: Ralf Koch, Freiensteinau (DE); Juergen Schoettle, Markgroeningen (DE); Marcus Bremmer, Benningen a. N. (DE); Jens Doeblitz, Stuttgart (DE); Michael Wolf, Kornwestheim (DE)

(73) Assignees: Vacuumschmelze GmbH & Co. KB, Hanau (DE); Bosch GmbH, Stuttgart-Feuerback (DE)

( * ) Notice: Subject to any disclaimer, the term of this patent is extended or adjusted under 35 U.S.C. 154(b) by 397 days.

This patent is subject to a terminal disclaimer.

(21) Appl. No.: 13/000,069

(22) PCT Filed: Jun. 17, 2009

(86) PCT No.: PCT/EP2009/004503
§ 371 (c)(1),
(2), (4) Date: Dec. 20, 2010

(87) PCT Pub. No.: WO2009/156114
PCT Pub. Date: Dec. 30, 2009

(65) Prior Publication Data
US 2012/0091996 A1    Apr. 19, 2012

(30) Foreign Application Priority Data
Jun. 20, 2008  (DE) .......................... 10 2008 029 475

(51) Int. Cl.
*G01R 15/18* (2006.01)

(52) U.S. Cl.
USPC .................. 324/127; 324/117 R; 324/117 H; 324/126

(58) Field of Classification Search
USPC ........................................... 324/127
See application file for complete search history.

(56) References Cited

U.S. PATENT DOCUMENTS 4,639,665 A * 1/1987 Gary .......................... 324/117 H
4,785,236 A * 11/1988 Balogh et al. ................. 324/120

(Continued)

FOREIGN PATENT DOCUMENTS

DE     3611683 A1   10/1987
DE     42 29 948 A1   3/1994

OTHER PUBLICATIONS

International Search Report and Written Opinion dated Nov. 27, 2009 for International Application No. PCT/EP2009/004503.

(Continued)

*Primary Examiner* — Richard Isla Rodas
(74) *Attorney, Agent, or Firm* — Dickinson Wright PLLC

(57) ABSTRACT

A method and an array for measuring a primary current in a primary conductor that is magnetically coupled to a secondary conductor via a ferromagnetic core. In said method, a voltage having a specific amplitude is applied to the secondary conductor such that a secondary current flows for reversing the magnetization of the ferromagnetic core; the secondary current is measured while the magnetization of the ferromagnetic core is reversed in order to obtain a first measured value; the polarity of the voltage is reversed such that a secondary current flows for once again reversing the magnetization of the ferromagnetic core; the secondary current is measured while the magnetization of the core is reversed in order to obtain a second measured value; the primary current is calculated in accordance with the first and the second measured value, the polarity of the voltage being regularly reversed at a certain sensor frequency that is continuously varied.

14 Claims, 7 Drawing Sheets

(56) References Cited

U.S. PATENT DOCUMENTS

| | | | |
|---|---|---|---|
| 5,450,000 A * | 9/1995 | Olsen | 323/222 |
| 5,811,965 A * | 9/1998 | Gu | 324/117 R |
| 5,828,295 A * | 10/1998 | Mittel et al. | 340/407.1 |
| 6,184,673 B1 | 2/2001 | Blakely | |
| 6,384,556 B1 * | 5/2002 | Mizumoto et al. | 318/293 |
| 6,768,296 B2 * | 7/2004 | Fiedler et al. | 324/117 R |
| 7,071,678 B2 * | 7/2006 | Karlsson et al. | 324/117 R |

OTHER PUBLICATIONS

Examination Report dated Apr. 24, 2009 for German Patent Application No. 10 2008 029 475.6-35.

* cited by examiner

CURRENT SENSOR ARRANGEMENT FOR MEASURING CURRENTS IN A PRIMARY CONDUCTOR

BACKGROUND

1. Field

Disclosed herein is a current sensor arrangement for measuring currents in a primary conductor over a wide measurement range.

2. Description of Related Art

For proximity and thus potential-free measurement of the strength of an electrical current in a conductor, on the one hand so-called direct-imaging current sensors are known which detect the magnetic flux which has been caused by the current, for example by means of a Hall sensor in a slotted magnetic circuit, and generate a signal which is proportional to the current strength. These sensors are very economical, but have relatively low accuracy. Direct-imaging current sensors are so-called open-loop current sensors which do not contain a closed control circuit.

Furthermore, so-called closed loop current sensors are known in which an opposing magnetic field of the same size as the magnetic field of the current to be measured is continuously generated using a closed control circuit, so that complete magnetic field compensation continuously occurs, and the magnitude of the current to be measured can be deduced from the parameters for generating the opposing field. Closed loop current sensors therefore belong to the class of compensation current sensors.

One special type of compensation current sensors which, however, do not contain a closed control circuit are flux gate sensors embodiments of which, for example, are described in document DE 42 29 948. Since hysteresis errors are avoided in these current sensors, they are suitable for precise current measurement in a wide dynamic range from a few milliamperes to roughly one kiloampere.

Flux gate sensors do not enable continuous current measurement, but the output signal of the sensor is a periodic signal which is sampled at certain sampling times. The sample values represent the current in the primary conductors (primary current) at the discrete sampling instants.

When the frequency of the primary current is similar or equal to the sampling frequency, in the sampled output signal of the sensor, as a result of aliasing effects, beats become visible. These beats lie in a frequency range which is important for current measurement, and thus clearly disrupt the measurement. This disruption can go so far that, in many cases, meaningful current measurement becomes impossible, as a result of which the domain of practical application of the current sensor is greatly limited. Furthermore, these current sensors generally have recurring time intervals in which the current cannot be measured at all.

SUMMARY

Therefore, there remains a need for a flexible current sensor arrangement for measuring currents in a primary conductor in which the above described problem does not occur.

This need is satisfied by embodiments by a current sensor arrangement and by a method as described herein.

One embodiment disclosed herein relates to a current sensor arrangement for measuring a primary current in a primary conductor. It comprises a ferromagnetic core for magnetic coupling of the primary conductor to a secondary conductor; a controlled voltage source which is connected to the secondary conductor; a trigger connected to the secondary conductor for regular magnetic reversal of the ferromagnetic core, wherein the trigger has a controlled voltage source which is connected to the secondary conductor. The trigger is designed to make available a bipolar periodic voltage of a certain amplitude so that a resulting periodic secondary current causes the magnetic reversal of the ferromagnetic core which is periodic according to the sensor frequency; and a controller for controlling the voltage source, the controller being designed to vary the sensor frequency during operation of the current sensor arrangement.

Another embodiment disclosed herein relates to a method for measuring a primary current in a primary conductor which is magnetically coupled to a secondary conductor via a ferromagnetic core. The method comprises the following steps: applying a voltage of a certain amplitude to the secondary conductor, so that a secondary current flows for magnetic reversal of the ferromagnetic core; measuring the secondary current during magnetic reversal of the core in order to obtain a first measured value; reversing of the polarity of the voltage so that a secondary current flows for repeated magnetic reversal of the ferromagnetic core; and measuring of the secondary current during magnetic reversal of the core in order to obtain a second measured value; computing the primary current depending on the first and the second measured value, wherein polarity reversal of the voltage takes place generally with a certain sensor frequency and wherein the sensor frequency is continuously varied.

Here the amplitude of the voltage can be varied such that the frequency of the secondary current is varied accordingly. In the so-called partial hysteresis method, the magnetization range during polarity reversal can be varied over the instant of polarity reversal of the voltage, as a result of which the frequency of the secondary current is likewise varied. In this case the core is not completely remagnetized.

BRIEF DESCRIPTION OF DRAWINGS

Embodiments described herein are detailed below using the figures, the same reference numbers labelling the same components or the same signals.

DETAILED DESCRIPTION OF SPECIFIC EMBODIMENTS

Figure 1:
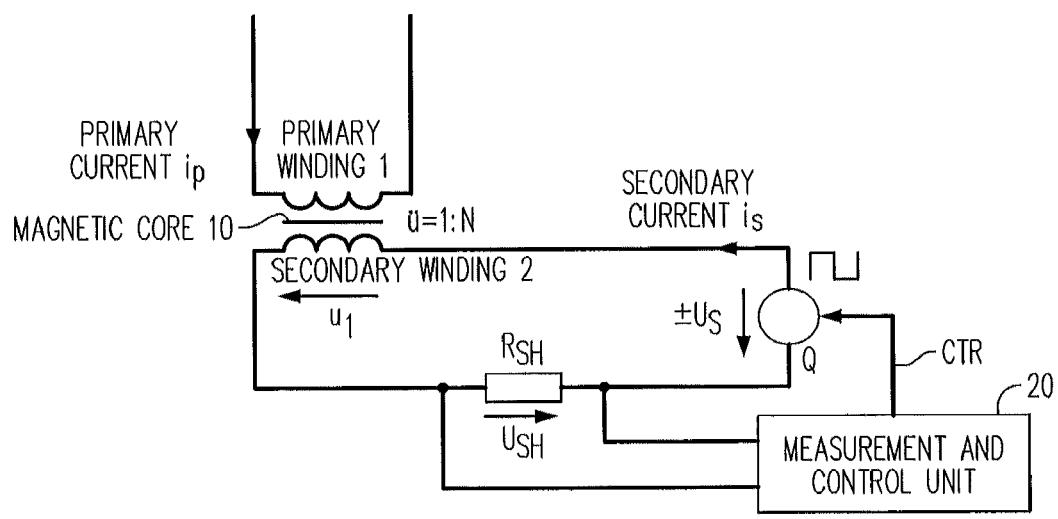
FIG. 1 is a schematic diagram of one example of the current sensor arrangement as described herein.

FIG. 1 is a schematic diagram that shows the fundamental structure of a compensation current sensor without hysteresis faults. The current to be measured (primary current $i_P$) flows through a primary winding 1 which is magnetically coupled to a secondary winding 2 (number of turns per unit length N) via a soft-magnetic and, for example, unslotted core 10. The primary winding 1 can consist for example of a single turn, i.e. the primary winding 1 is formed from a conductor which is routed through the core 10 (number of turns per unit length 1). The secondary winding 2 is connected in series to a controlled voltage source Q which produces the secondary current $i_S$ through the secondary wiring. To measure the secondary current $i_S$, a shunt resistor $R_{SH}$ is connected between the secondary winding 2 and the voltage source Q. The voltage $U_{SH}$ is supplied via the shunt resistor $R_{SH}$ to a measurement and control unit 20 which also makes available a control signal CTR for triggering the controlled voltage source Q.

Figure 2A:
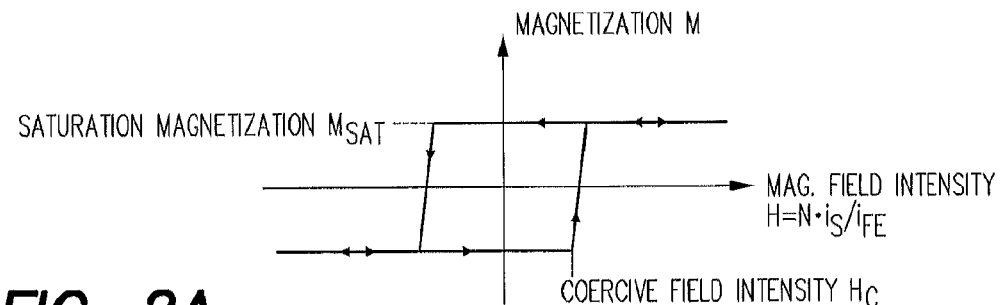
FIG. 2 is a graph that shows the signal characteristic of the secondary current, the magnetization and the magnetic field intensity for a freely oscillating current sensor arrangement with a primary current of zero.

The manner of operation of the current sensor arrangement which is shown in FIG. 1 is described below using FIGS. 2 to 4. FIG. 2a describes the ferromagnetic properties of the soft magnetic core 10 using a magnetization characteristic, the magnetic field intensity H being plotted on the x-axis and the magnetization M being plotted on the y-axis. The magnetization characteristic has roughly rectangular hysteresis with a certain coercive field intensity $H_C$ and a certain saturation magnetization $M_{SAT}$. In simplified terms $H = N \cdot i_S / l_{FE}$ applies to the magnetic field intensity H according to Ampere's Law, the parameter $l_{FE}$ designating the magnetic path length of the magnetic field lines in the core 10.

The following applies to the voltage $u_i$ which has been induced in the secondary coil 2 according to Faraday's law $$u_i = -N \cdot d\Phi/dt = -N \cdot A \cdot dB/dt, \quad (1)$$

the parameter A being the cross sectional area of the core 10, the symbol $\Phi$ being the magnetic flux through the core 10 caused by the secondary current $i_S$ and the symbol B designating the magnetic flux density. The magnetic flux density can generally be represented by the relation $B = \mu_0 \cdot (H+M)$; it follows that during magnetic reversal of the core 10 (corresponds to the left or right vertical branch of the magnetization characteristic in FIG. 2a) the rate of change of the magnetization dM/dt is proportional to the induced voltage $u_i$ and here the magnetic field intensity H and thus also the secondary current $i_S$ are constant, i.e.

$$u_i = -N \cdot A \cdot \mu_0 \cdot dM/dt \text{ (during magnetic reversal)} \quad (2)$$

It can also be stated that the differential inductance of the secondary coil 2 is almost infinitely large during magnetic reversal. As soon as the magnetization in the core 10 has reached the saturation magnetization $M_{SAT}$, the secondary current $i_S$ rises and is only further limited by the ohmic resistance of the secondary winding 2 and the shunt resistor $R_{SH}$.

Figure 2B:
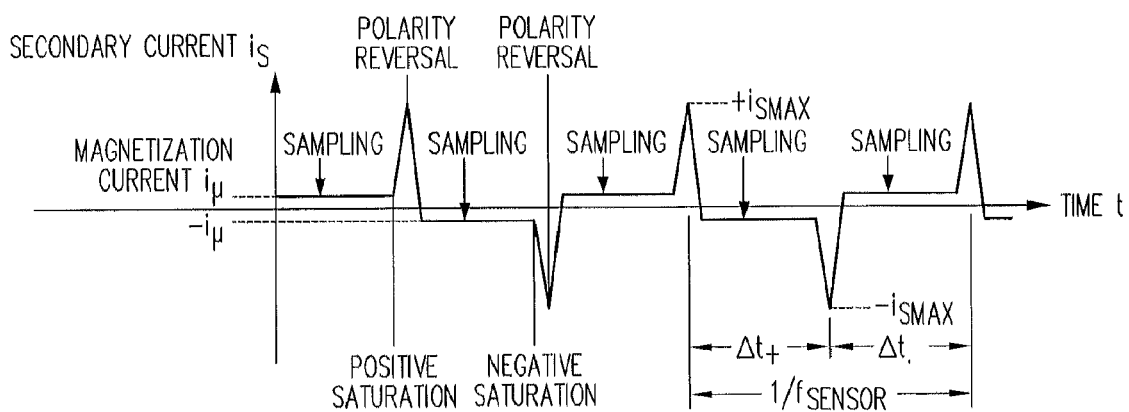

The rising of the secondary current $i_S$ is recognized by the measurement and control unit 20 for example using comparators (compare FIG. 2b). As soon as the secondary current exceeds a positive threshold value $+i_{SMAX}$ or undershoots a negative threshold value $-i_{SMAX}$ the measurement and control unit 20 generates a corresponding control signal CTR in order to reverse the polarity of the voltage source Q and to initiate the next magnetic reversal cycle.

The time characteristic of the secondary current at a primary current $i_P$ of zero is shown in FIG. 2b. During magnetic reversal (compare the roughly vertical branches of the magnetization characteristic from FIG. 2a) the secondary current is constant and corresponds to the magnetization current $+i_\mu$ or $-i_\mu$. The amount of the magnetization current $i_\mu$ depends on the width of the hysteresis in the magnetization characteristic, therefore on the coercive field intensity $H_C$, i.e. $i_\mu = l_{FE}/N \cdot H_C$. As soon as the magnetization in the core 10 reaches the positive or negative saturation magnetization, the secondary current $i_S$ begins to rise as described above. As a result of the symmetry of the hysteresis characteristic the time behavior of the secondary current $i_S$ is also symmetrical around an average current value.

Figure 3A:
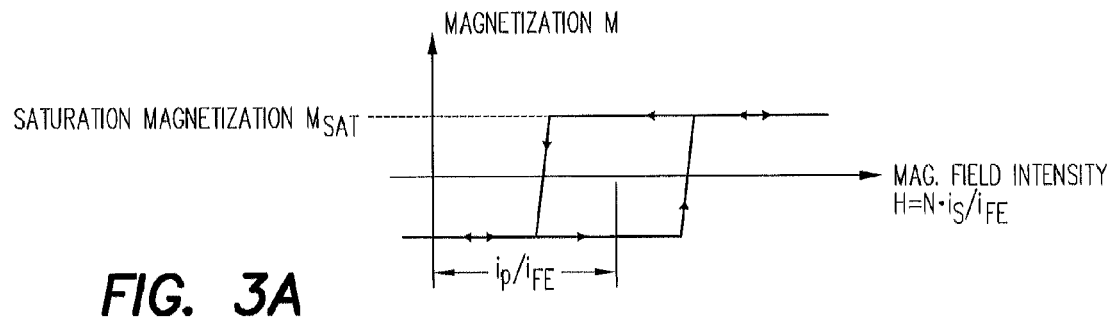
FIG. 3 is a graph that shows the signal characteristic of the secondary current, the magnetization and the magnetic field intensity for a freely oscillating current sensor arrangement with a primary current greater than zero.
Figure 3B:
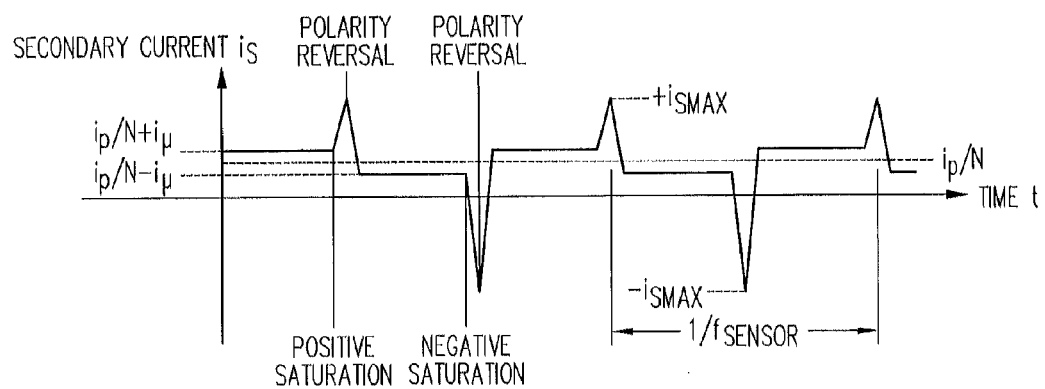

FIGS. 3a and 3b show the same circumstance as FIGS. 2a and 2b, but for a primary current $i_P$ which is not equal to zero. The magnetic field which has been generated by the primary current $i_P$ is additively superimposed in the soft magnetic core 10 onto the magnetic field of the secondary current $i_S$; this can be represented as a shift of the magnetization characteristic along the abscissa. This circumstance is illustrated in FIG. 3a. The corresponding time characteristic of the secondary current is shown in FIG. 3b. This is similar to as in FIG. 2b for a primary current of zero with the difference that the secondary current no longer runs symmetrically around the x-axis ($i_S = 0$), but symmetrically around the horizontal line ($i_S = i_P/N$). This means that during magnetic reversal the primary current and secondary current are in the same ratio ü=1:N as the number of turns per unit length of the primary winding 1 and secondary winding 2, except for the hysteresis offset at the level of the magnetization current $i_\mu$. To measure the current, the secondary current signal $i_S$, strictly speaking the voltage signal $U_{SH}$ on the shunt resistor $R_{SH}$, is sampled during the magnetic reversal process. Thus, in the first half of the period of the secondary current a measured current value $i_S[n-1] = (i_P/N) + i_\mu$ is obtained, and in the second half of the period a measured current value $i_S[n] = (i_P/N) - i_\mu$ is obtained. By averaging, the hysteresis error which is caused by the magnetization current can be eliminated, the primary current at a sampling instant n is computed as follows:

$$i_P[n] = N \cdot (i_S[n-1] + i_S[n])/2 \quad (3)$$

Because the hysteresis of the magnetization characteristic has no effect on the measurement result, this current measurement method is very well suited to the measurement of very small currents. The measurement range extends from a few milliamperes to one kiloampere. During the magnetic reversal process in the core 10 the secondary current $i_S$ follows the primary current $i_P$ according to the transmission ratio 1:ü. The secondary current is sampled at least once during this time in order to obtain a measured value ($i_S + i_\mu$ or $i_S - i_\mu$) for computing the primary current. During magnetic reversal the sampling however can also take place repeatedly with a sampling rate which is much higher than the oscillation frequency of the sensor itself, for example with sampling frequencies between 1 kHz and 1 MHz. Thus it is possible to also detect transient processes in the primary current signal $i_P$, as long as these transient processes occur during magnetic reversal. While the core 10 is in magnetic saturation, meaningful current measurement is not possible. This process is described more precisely below using FIG. 4b.

Due to the fact that the above described current sensor arrangement does not allow continuous measurement, but the secondary current is sampled only at discrete instants, unwanted aliasing effects can occur which are manifested in the measurement result mainly as low-frequency beats. Sampling can, for example, always be triggered a fixed time after polarity reversal of the voltage $U_S$ of the current source Q, and the time can be chosen to be so short that the secondary current $i_S$ is tuned, i.e. follows the primary current $i_P$. The aforementioned aliasing problem is shown for example in FIG. 4a.

If the frequency of the primary current $i_P$ is equal to or at least of similar magnitude to the oscillation frequency of the sensor arrangement, i.e. of the secondary current $i_S$, or is an integral multiple thereof, unwanted beats can superimpose the measurement signal so that meaningful measurement is impossible. In this case the primary current $i_P$ is modulated with a rectangular signal whose frequency is of a similar order of magnitude as twice the oscillation frequency $f_{SENSOR}$ of the current sensor, i.e. near the sampling frequency. In this case, aliasing effects occur which act as low frequency beats in a frequency range which is important for the measurement.

Figure 4A:
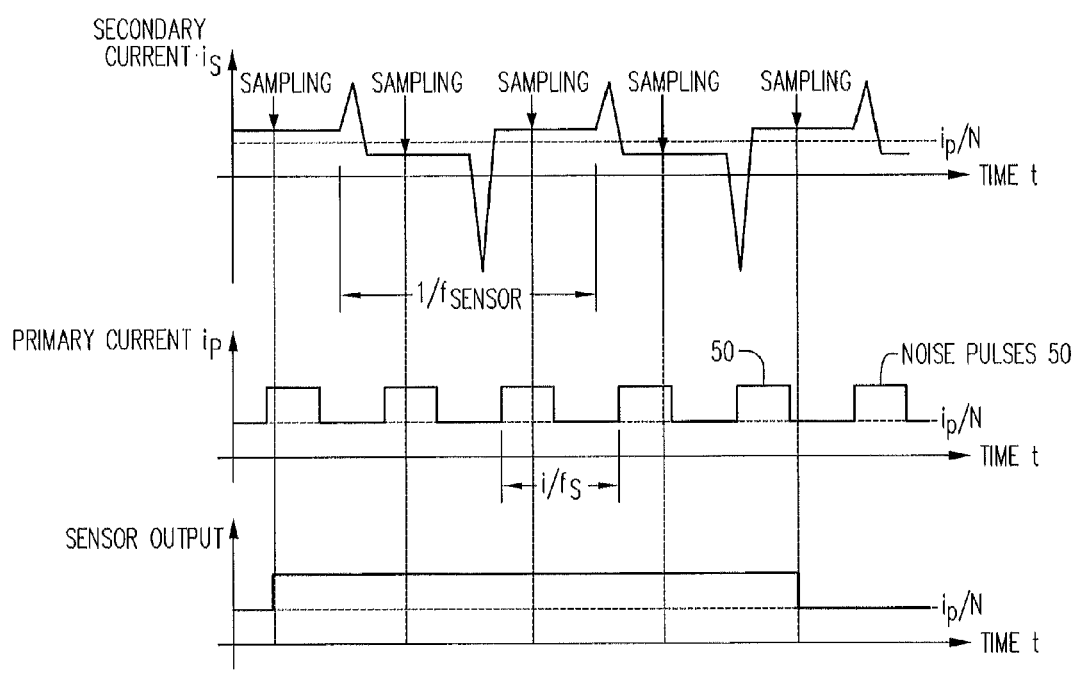
FIG. 4 is a graph that shows the aliasing effect (a) which is possible for the current sensor and "blind" time intervals of the sensor (b) using the signal characteristics of the primary and second current.

In the example shown in FIG. 4a, noise pulses 50 are superimposed on the primary current $i_P$ at the same time and repeat with a frequency $f_S$. The frequency $f_S$ of the noise pulses 50 is of a similar order of magnitude as twice the sensor oscillation frequency $f_{SENSOR}$. The difference between $f_S$ and $2f_{SENSOR}$ is so great that a beat with a beat frequency of roughly half the sensor frequency results. If the difference were less, the beat frequency is clearly still smaller.

Figure 4B:
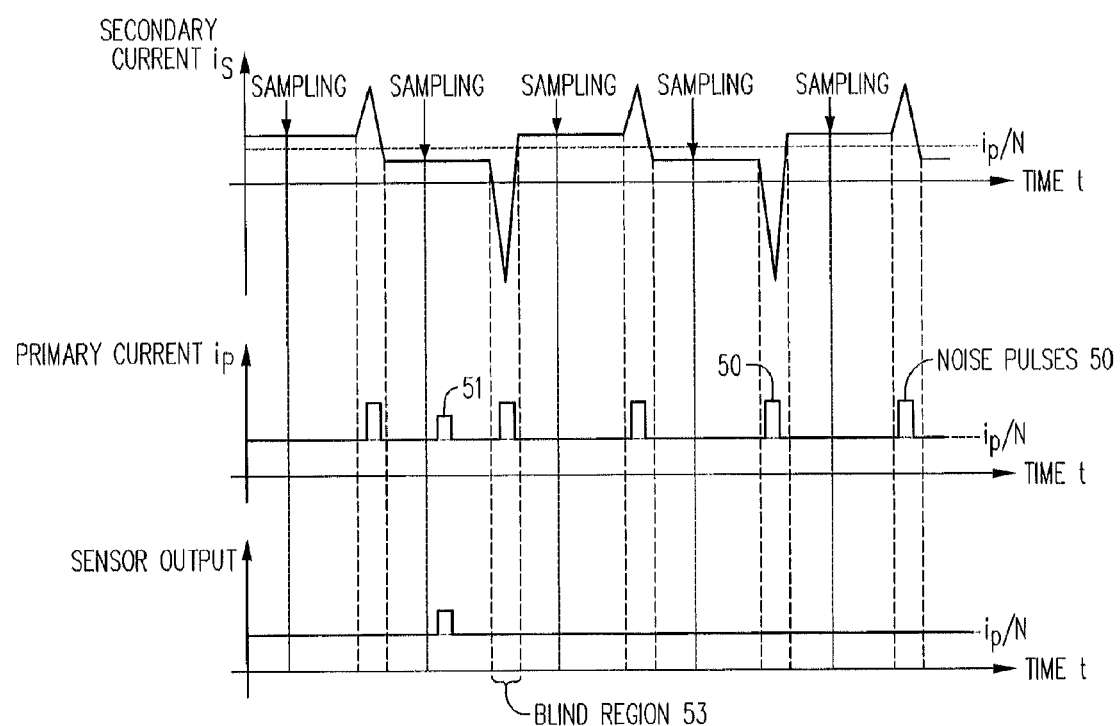

Another problem of conventional flux gate sensors is illustrated using FIG. 4b. During magnetic reversal of the core the secondary current $i_S$ follows (compare FIGS. 2 and 3) the primary current $i_P$ according to the transmission ratio 1:ü and more or less continuous current measurement is possible. In contrast, in the region of magnetic saturation of the core 10 a meaningful measurement is not possible, the sensor is therefore essentially "blind" during certain time intervals 53 in which the core is in magnetic saturation. These time intervals 53 occur periodically with twice the oscillation frequency $f_{SENSOR}$ of the current sensor; this results in that pulsed current portions 50, which occur within the time interval 53, are not detected by the sensor at all even if these current pulses 50 occur periodically. Current pulses 51 which occur during magnetic reversal of the core 10 can be easily detected by the sensor when sampling of the secondary current $i_S$ takes place with a sampling frequency which is large enough to trigger the current pulse 51.

Equation (2) shows that the higher the rate of the magnetic reversal process is the higher the amplitude $U_S$ of the voltage generated by the voltage source Q, since it follows from eq. (2):

$$dM/dt = -u_i/(N \cdot A \cdot \mu_0) = -(U_S - R_{SH} \cdot i_S)/(N \cdot A \cdot \mu_0) \quad (4)$$

Consequently, the higher the oscillation frequency of the secondary current is the higher the amplitude $U_S$ of the voltage generated by the voltage source Q. The oscillation frequency $f_{SENSOR}$ of the sensor follows from eq. (4):

$$f_{SENSOR} = 1/(\Delta t_+ + \Delta t_-), \quad (5a)$$

wherein $$\Delta t_+ = (\mu_0 \Delta M \cdot N \cdot A)/(U_S - i_P \cdot R_{SH}/N) \quad (5b)$$

$$\Delta t_- = (\mu_0 \Delta M \cdot N \cdot A)/(U_S + i_P \cdot R_{SH}/N) \quad (5c)$$

The parameter $\Delta M$ is the magnetization range during a magnetic reversal process. Equations (5a) to (5c) indicate that the oscillation frequency $f_{SENSOR}$ of the sensor on the one hand depends on the primary current itself, and also on the voltage amplitude $U_S$ of the voltage generated by the voltage source Q and on the magnetization range $\Delta M$.

If, in a specific application, the signal frequency of the primary current $i_P$ is similar or equal to the oscillation frequency $f_{SENSOR}$ of the sensor or is a multiple thereof, in order to avoid the unwanted aliasing effect which is described in FIG. 4a, the oscillation frequency $f_{SENSOR}$ can be matched accordingly by changing the voltage amplitude $U_S$ or the magnetization range $\Delta M$ in order to avoid unwanted effects. In this way the time intervals 53 in which a meaningful current measurement is not possible (compare FIG. 4b) are shifted so that periodically occurring pulses 50 are not continuously "overlooked".

In a freely oscillating current sensor arrangement whose secondary current characteristic is shown in FIG. 2, the magnetization range $\Delta M$ is stipulated by the saturation magnetization $M_{SAT}(\Delta M = 2 \cdot M_{SAT})$ so that a variation of the oscillation frequency $f_{SENSOR}$ can easily take place via a variation of the voltage amplitude $U_S$ of the current source Q. The voltage amplitude is triggered for example by way of a control signal from the measurement and control unit 20 such that the oscillation frequency $f_{SENSOR}$ of the current sensor arrangement varies continuously during operation. In this way the result can be that interference 50 with a certain frequency in the sampled sensor signal (measurement signal) no longer appears as a beat. Instead, in the measurement signal only irregular noise pulses continue to be seen which however do not seriously adversely affect the measurement—in contrast to the effect of the beat.

Figure 6:
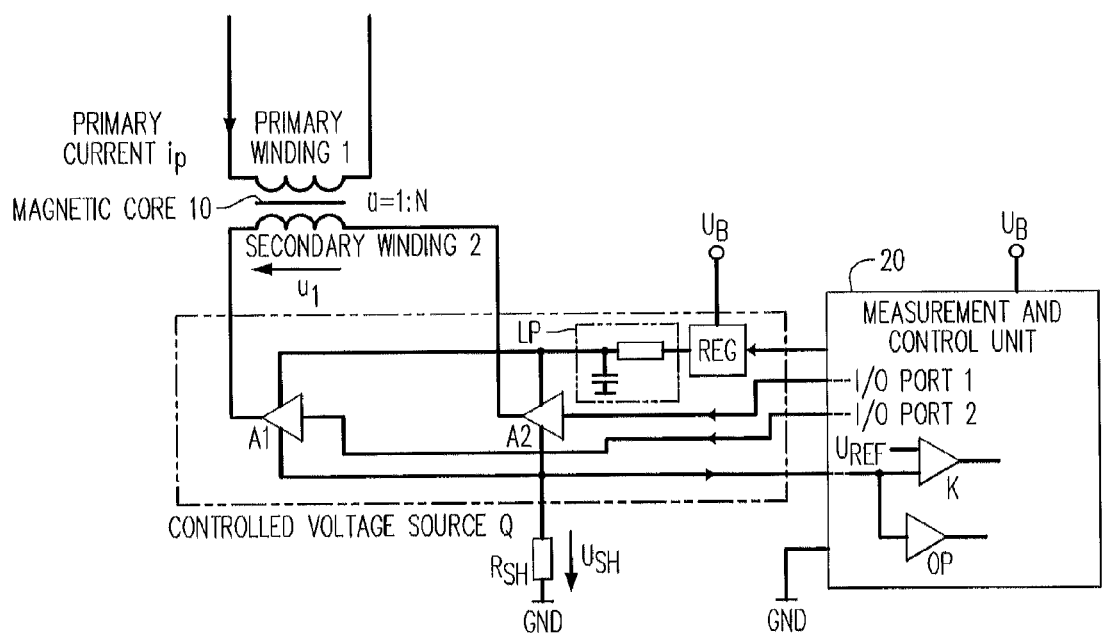
FIG. 6 is a schematic that shows the exemplary embodiment as shown in FIG. 1 in more detail.

Variation or adaptation of the sensor frequency $f_{SENSOR}$ is controlled by the measurement and control unit 20 (compare FIGS. 1 and 6). The measurement and control unit 20 can be made for example to stochastically vary the sensor frequency $f_{SENSOR}$. Alternatively the sensor frequency $f_{SENSOR}$ can also be varied according to a certain stipulated frequency pattern. This can be achieved for example by the control means amplitude-modulating the amplitude of the voltage source Q (see FIG. 1), as a result of which the sensor frequency $f_{SENSOR}$ is frequency-modulated. In general, the sensor frequency can be varied in a certain range by changing the voltage amplitude of the voltage source Q (compare equations 5a-c). If the frequency $f_S$ of the interference 50 (compare FIG. 4a) is known, it can be a good idea to make the measurement and control unit 20 such that the sensor frequency $f_{SENSOR}$ or an integral multiple thereof differs so dramatically from the frequency $f_S$ of the interference 50 that the resulting beat occurs in a frequency range which is not relevant to the measurement, for example in a frequency range above the frequency range of interest for the measurement.

Figure 5A:
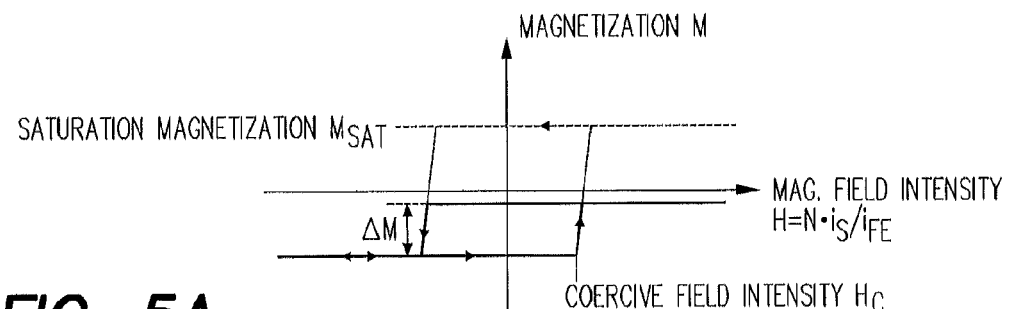
FIG. 5 is a graph that shows the signal characteristic of the secondary current, the magnetization and the magnetic field intensity for a current sensor arrangement in partial hysteresis operation with a primary current of zero
Figure 5B:
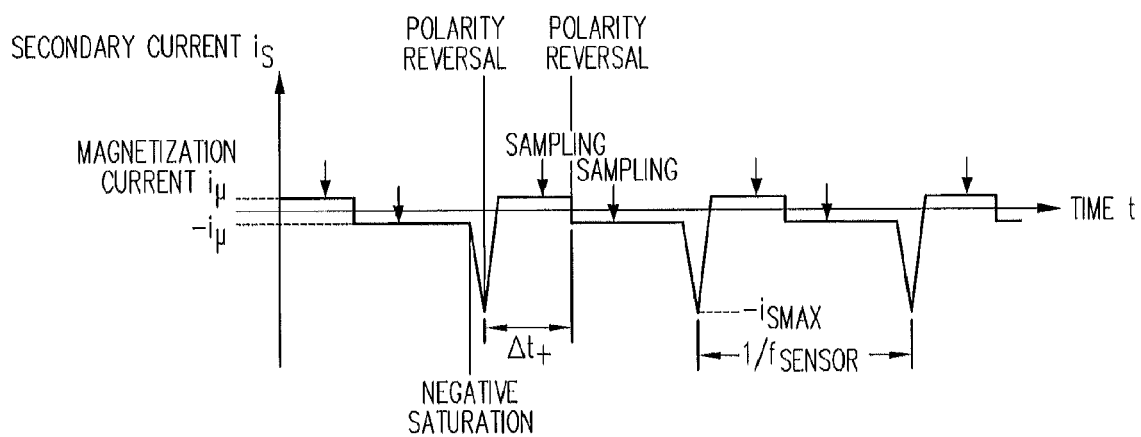

As already indicated above, the oscillation frequency $f_{SENSOR}$ of the sensor can also be adapted by changing the magnetization range $\Delta M$. In this case the current sensor arrangement may no longer oscillate freely and at least the magnetic reversal process must take place time-controlled in one direction. It follows that all the hysteresis of the magnetization characteristic is no longer passed through (compare FIGS. 2a and 3a), but only part of the hysteresis, for example 20 to 30 percent. This case (partial hysteresis method) is shown in FIGS. 5a and 5b.

In the partial hysteresis method at least the part $\Delta t_+$ or alternatively $\Delta t_-$ of the period duration $f_{SENSOR}^{-1}$ of the sensor oscillation frequency is stipulated, i.e. the polarity of the voltage source Q is reversed after a certain time $\Delta t_+$ before the core 10 reaches its saturation magnetization $M_{SAT}$. Thereupon, the soft-magnetic core 10 is again remagnetized up to saturation magnetization $M_{SAT}$ and the cycle begins from the start. In principle magnetic reversal could also take place in two directions in a time-controlled manner, but then it can occur that the part of the hysteresis curve which has actually been traversed "drifts" due to inevitable inaccuracies within the entire hysteresis curve. In order to always start the magnetic reversal from a certain reference point of the hysteresis curve, at least every other magnetic reversal process (as is in the example from FIG. 3) can take place comparator-controlled after the core has been magnetized into saturation.

Otherwise a sensor which works according to the partial hysteresis method functions the same as already described using FIGS. 2 and 3. The sole difference is that the magnetic reversal takes place only in one direction controlled by a comparator as in the method from FIG. 2, magnetic reversal takes place time-controlled in the other direction by the stipulation of the time interval $\Delta t_+$ or $\Delta t_-$, as a result of which the magnetization range $\Delta M$ is set according to equation (5b).

Analogously to the above described case in which adaptation of the voltage amplitude $U_S$ takes place, in the partial hysteresis method the magnetization range $\Delta M$ can be adapted over the time interval $\Delta t_+$ (or $\Delta t_-$) for example by way of a control signal CTR from the measurement and control unit 20 such that the oscillation $f_{SENSOR}$ of the current sensor arrangement during operation is continuously varied. In this case the variation of the sensor frequency $f_{SENSOR}$ can take place randomly or according to a certain frequency pattern by way of variation of the magnetization range $\Delta M$ or of the instant of polarity reversal of the voltage source Q.

Analogously to the above described amplitude modulation of the voltage $U_S$ of the current source Q, in the partial hysteresis method the magnetization range $\Delta M$ can be modulated by way of modulation of the time interval $\Delta t_+$ or $\Delta t-$. In order to attain frequency modulation of the sensor frequency $f_{SENSOR}$ the instant of polarity reversal of the voltage source Q can be modulated around an average. If the frequency $f_S$ of the interference 50 (compare FIG. 4*a*) is known, the sensor frequency $f_{SENSOR}$ can be set such that it or an integral multiple thereof differs dramatically from the frequency $f_S$ of the interference 50 such that the resulting beat occurs in a frequency range which is not relevant to the measurement.

FIG. 6 shows one example of the practical implementation of the sensor arrangement from FIG. 1. The voltage source Q is formed from two push-pull end stages A1 and A2 with low ohmic output resistance, which stages are supplied by way of a voltage regulator REG. One terminal of the secondary winding 2 at a time is connected to the outputs of the two end stages A1 and A2. The shunt resistor $R_{SH}$ is connected to the supply current path of the end stages, in this case one terminal of the shunt resistor $R_{SH}$ is connected to the ground potential in order to obtain a current signal $U_{SH}$ to ground. The current signal $U_{SH}$, i.e. the voltage which drops over the shunt resistor $R_{SH}$, is supplied to the measurement and control unit 20. The inputs of the push-pull end stages are connected to one I/O port of the measurement and control unit 20 each and are always triggered in the opposite direction. In the supply current path of the end stages a lowpass LP can be optionally connected in order to limit the maximum rate of change of the secondary current $i_S$. The measurement and control unit 20 also comprises an amplifier OP for amplifying the current measurement signal $U_{SH}$. This signal is supplied for example processed or unprocessed to an analog-digital converter (ADC) in order to obtain a digital measurement value. To determine the instant of magnetic reversal of the soft-magnetic core 10 the measurement and control unit 20 can also have a comparator K which compares the current measurement signal $U_{SH}$ to the reference signal $U_{REF}$ which represents the maximum secondary current value $i_{SMAX}$.

The invention having been thus described with reference to certain specific embodiments and examples thereof, it will be understood that this is illustrative, and not limiting, of the appended claims.

The invention claimed is:

1. A current sensor arrangement for measuring a primary current in a primary conductor, comprising:
    a secondary conductor,
    a ferromagnetic core for magnetic coupling of the primary conductor to the secondary conductor;
    a controlled voltage source which is electrically connected to the secondary conductor;
    wherein the controlled voltage source makes available a bipolar periodic voltage of a certain amplitude so that a resulting periodic secondary current flowing in the secondary conductor causes a magnetic reversal of the ferromagnetic core which is periodic according to a sensor oscillation frequency; and
    a controller for controlling the voltage source, which in operation modulates the voltage amplitude of the voltage source, or modulates the time interval to the instant of polarity reversal of the voltage source, and thus varies the sensor oscillation frequency during operation of the current sensor arrangement.

2. The current sensor arrangement as claimed in claim 1, wherein the controller in operation varies the sensor frequency stochastically.

3. The current sensor arrangement as claimed in claim 1, wherein the controller in operation varies the sensor frequency according to a certain frequency pattern.

4. The current sensor arrangement as claimed in claim 1, wherein a primary current flowing in the primary conductor has signal portions of a certain signal frequency and wherein the controller in operation varies the sensor frequency as a function of the signal frequency such that the sensor frequency or an integral multiple thereof differs from the signal frequency.

5. The current sensor arrangement as claimed in claim 1, wherein the controller in operation modulates the voltage amplitude of the voltage source, and thus varies the sensor frequency.

6. The current sensor arrangement as claimed in claim 1, wherein the controller in operation modulates the time interval to the instant of polarity reversal of the voltage source, and thus varies the sensor frequency.

7. A method for measuring a primary current in a primary conductor which is magnetically coupled to a secondary conductor via a ferromagnetic core, comprising:
    applying a voltage of a certain amplitude to the secondary conductor, thereby causing a secondary current flow for magnetic reversal of the ferromagnetic core;
    measuring the secondary current during magnetic reversal of the ferromagnetic core, thereby obtaining a first measured value;
    reversing the polarity of the voltage, thereby causing a secondary current flow for repeated magnetic reversal of the ferromagnetic core;
    measuring the secondary current during magnetic reversal of the core, thereby obtaining a second measured value;
    computing the primary current depending on the first and the second measured value, wherein the reversing the polarity of the voltage occurs generally with a sensor oscillation frequency and, wherein the voltage amplitude of the voltage source, or the time interval to the instant of polarity reversal of the voltage source, are modulated, and thus the sensor oscillation frequency is continuously varied.

8. The method as claimed in claim 7, wherein the sensor frequency is stochastically varied.

9. The method as claimed in claim 7, wherein the sensor frequency is varied according to a certain frequency pattern.

10. The method as claimed in claim 7, wherein the primary current has signal portions of a certain signal frequency and wherein the sensor frequency is varied depending on the signal frequency such that the sensor frequency or an integral multiple thereof differs from the signal frequency.

11. The method as claimed in claim 7, wherein the amplitude of the voltage is modulated, as a result of which the sensor frequency is varied.

12. The method as claimed in claim 11, wherein the amplitude of the voltage is amplitude-modulated so that the sensor frequency is frequency-modulated.

13. The method as claimed in claim 7, wherein time interval to the instant of polarity reversal of the voltage is modulated, as a result of which the sensor frequency is changed.

14. The method as claimed in claim 13, wherein the instant of polarity reversal of the voltage is modulated periodically around an average value.

* * * * *